United States Patent
Sundblad et al.

(10) Patent No.: US 9,350,374 B2
(45) Date of Patent: May 24, 2016

(54) CONFIGURABLE TIME-INTERLEAVED ANALOG-TO-DIGITAL CONVERTER

(71) Applicant: Anacatum Design AB, Linköping (SE)

(72) Inventors: Rolf Sundblad, Ljungsbro (SE); Robert Hägglund, Linköping (SE); Staffan Holmbring, Linköping (SE)

(73) Assignee: ANACATUM DESIGN AB, Linköping (SE)

( * ) Notice: Subject to any disclaimer, the term of this patent is extended or adjusted under 35 U.S.C. 154(b) by 0 days.

(21) Appl. No.: 14/771,835

(22) PCT Filed: Mar. 7, 2014

(86) PCT No.: PCT/EP2014/054470
§ 371 (c)(1),
(2) Date: Sep. 1, 2015

(87) PCT Pub. No.: WO2014/135687
PCT Pub. Date: Sep. 12, 2014

(65) Prior Publication Data
US 2016/0020777 A1     Jan. 21, 2016

Related U.S. Application Data

(60) Provisional application No. 61/774,998, filed on Mar. 8, 2013.

(51) Int. Cl.
*H03M 1/00* (2006.01)
*H03M 1/12* (2006.01)
*G02F 7/00* (2006.01)

(52) U.S. Cl.
CPC ............ *H03M 1/1215* (2013.01); *H03M 1/004* (2013.01); *G02F 7/00* (2013.01); *H03M 1/00* (2013.01); *H03M 1/12* (2013.01); *H03M 1/123* (2013.01); *H03M 1/1225* (2013.01)

(58) Field of Classification Search
CPC ....... H03M 1/1225; H03M 7/00; H03M 1/00; H03M 1/12
USPC .......... 341/141, 142, 137, 120, 122, 110, 155
See application file for complete search history.

(56) References Cited

U.S. PATENT DOCUMENTS 7,292,170 B2   11/2007   Kinyua et al.
7,961,123 B2    6/2011   Nagarajan et al.
(Continued)

FOREIGN PATENT DOCUMENTS

EP    0624289 B1    9/1997
JP    H0645936 A    2/1994
(Continued)

OTHER PUBLICATIONS

PCT International Preliminary Report on Patentability dated Feb. 18, 2015 for PCT International Application No. PCT/EP2014/054467, 6 pages.
(Continued)

*Primary Examiner* — Joseph Lauture
(74) *Attorney, Agent, or Firm* — Remarck Law Group PLC

(57) ABSTRACT

A time-interleaved analog-to-digital converter for conversion of L analog input signals to L corresponding digital output signals comprises an array of N (N>L) constituent analog-to-digital converters each having an analog input and a digital output and each adapted to digitize an analog input sample, and a controller adapted to (for each of the L analog input signals indexed by i=1, 2, ..., L) select a number $N_i$, of constituent analog-to-digital converters from the array of N constituent analog-to-digital converters (wherein $N_i \geq 1$ and $\Sigma_{i=1}^{L} N_i \leq N$), and cause each sample of the analog input signal to be digitized in a respective one of the selected $N_i$ constituent analog-to-digital converters. The analog-to-digital converter also comprises a multiplexer adapted to (for each of the L analog input signals) multiplex the digitized samples of each of the selected Ni constituent analog-to-digital converters to produce the digital output signal.

16 Claims, 7 Drawing Sheets

(56) References Cited

U.S. PATENT DOCUMENTS

| | | |
|---|---|---|
| 8,310,387 B2 | 11/2012 | Harris et al. |
| 8,487,795 B1 | 7/2013 | Jiang et al. |
| 8,611,483 B2 | 12/2013 | Zhu et al. |
| 8,643,428 B2 | 2/2014 | Dedic et al. |
| 9,000,962 B1 | 4/2015 | Leuciuc |
| 2008/0158029 A1 | 7/2008 | Xu |
| 2010/0013692 A1 | 1/2010 | Yamamoto et al. |
| 2010/0277354 A1* | 11/2010 | Lee ............... H03M 1/1215 341/137 |
| 2011/0128175 A1 | 6/2011 | Harris et al. |
| 2011/0234435 A1 | 9/2011 | Woodward et al. |
| 2011/0304489 A1 | 12/2011 | Christer et al. |
| 2014/0152477 A1 | 6/2014 | Lewis et al. |
| 2014/0152478 A1 | 6/2014 | Lewis et al. |

FOREIGN PATENT DOCUMENTS

| | | |
|---|---|---|
| JP | 2011049746 A | 3/2011 |
| WO | 0044099 A1 | 7/2000 |
| WO | 2007093478 A1 | 8/2007 |
| WO | 2010042051 A1 | 4/2010 |
| WO | 2012123578 A1 | 9/2012 |

OTHER PUBLICATIONS

PCT International Preliminary Report on Patentability dated Feb. 9, 2015 for PCT International Application No. PCT/EP2014/054469, 6 pages.

PCT International Search Report dated Aug. 14, 2014 for PCT International Application No. PCT/EP2014/054470, 1 page.

PCT International Search Report dated Jul. 31, 2014 for PCT International Application No. PCT/EP2014/054467, 1 page.

PCT International Search Report dated May 28, 2014 for PCT International Application No. PCT/EP2014/054469, 2 pages.

Van Thillo, W. et al., "A Flexible Antenna Selection Scheme for 60 GHz Multi-Antenna Systems Using Interleaved ADCs," IEEE Communications Society, IEEE ICC 2009 Proceedings, Jun. 14, 2009, 5 pages.

* cited by examiner

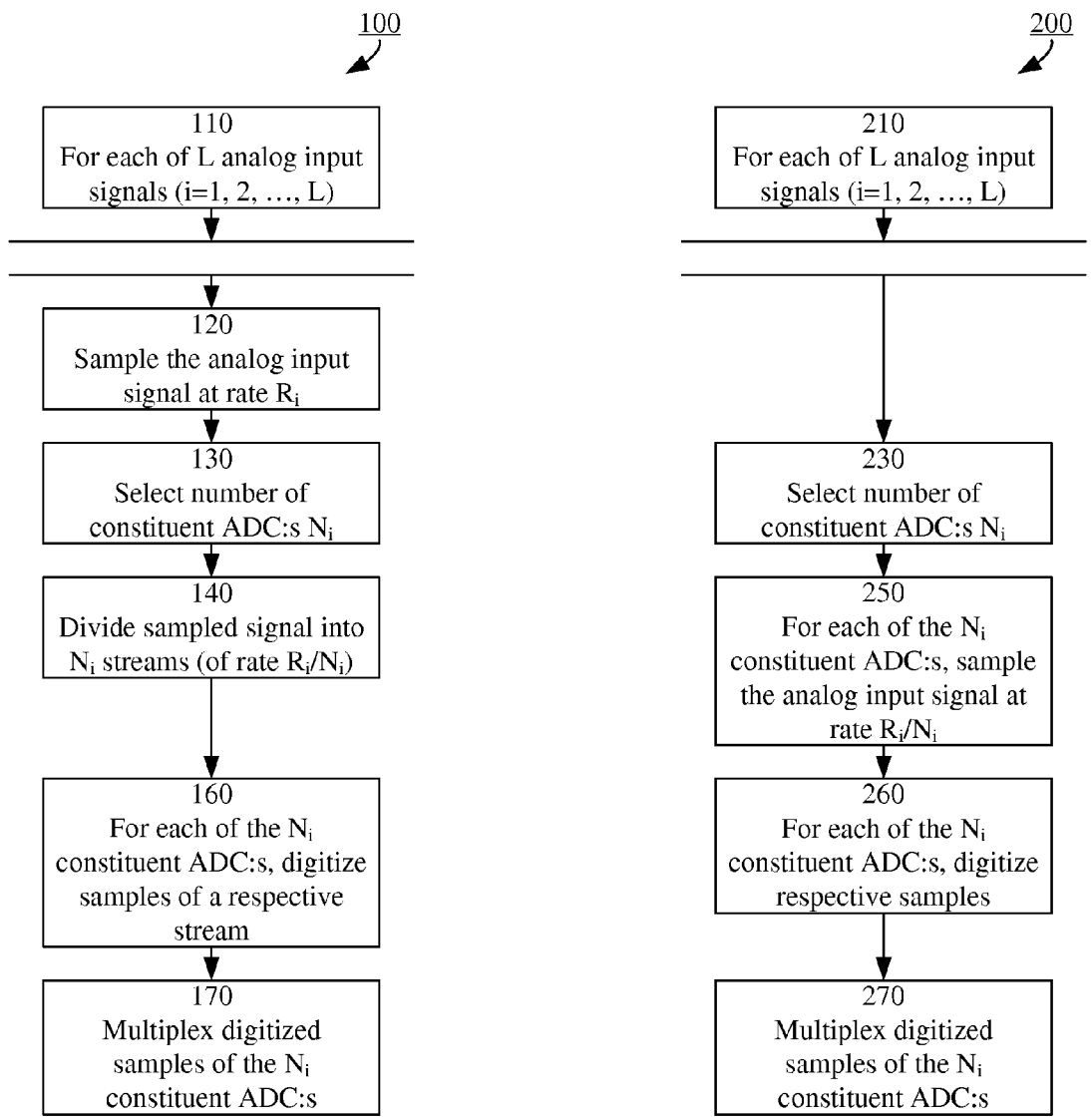

CONFIGURABLE TIME-INTERLEAVED ANALOG-TO-DIGITAL CONVERTER

CROSS-REFERENCE TO RELATED APPLICATIONS

This application is a 371 U.S. National Stage of International Application No. PCT/EP2014/054470, filed Mar. 7, 2014, which claims priority to U.S. Provisional Application No. 61/774,998, filed Mar. 8, 2013. The disclosure of each of the above applications is incorporated herein by reference in their entirety.

TECHNICAL FIELD

The present invention relates generally to the field of analog-to-digital converters. More particularly, it relates to a dynamically configurable time-interleaved analog-to-digital converter.

BACKGROUND

Electronic equipment (such as, for example, television sets and other audio/video equipments) are commonly implemented using digital technology instead of analog technology. Typically, the more advanced the digital technology gets the more demanding the task of converting an analog signal to a digital signal suitable for the digital technology implementation becomes.

Conceptually, an analog-to-digital converter (also denoted ADC or A/D converter) is very well know in the art as well as its basic functionality (sample-and-hold, quantization) and will not be elaborated on further herein.

For high sampling frequencies it may be necessary or at least beneficial to use ADC structures comprising several constituent ADC:s to be able to accommodate the high sampling frequency. Such structures alleviate the processing speed requirements on each constituent ADC. Examples of such ADC structures are pipe-lined ADC:s and time-interleaved ADC:s (e.g. parallel successive ADC:s). US 2011/0304489 A1, WO 2007/093478 A1, EP 0624289 B1 and WO 2010/042051 A1 describe various example time-interleaved ADC structures.

In a typical application of analog-to-digital conversion, it may be desirable to digitize two or more analog input signals wherein the corresponding digital signals should have different sampling rates and/or different resolution in each sample. This may be solved by using a separate ADC for each of the signals.

For example, in an audio/video application (processing of e.g. an audio input signal and three (RBG) video input signals) the video signal(s) typically require much higher sampling rates than the audio signal(s). The audio signal may typically be sufficiently processed (and even oversampled to achieve high dynamics) by a non-time-interleaved ADC, while each of the video signal(s) may require a time-interleaved ADC having several constituent ADC:s. Another example is in vehicle-related applications, where signals from a large number of sensors (and/or similar signal sources) may need processing with diverse ADC requirements.

A solution with a separate ADC for each of the signals may, however, not be eligible in all situations. For example, having each time-interleaved ADC designed for a particular type of signal, rate, and/or resolution may be inflexible and/or inefficient. For example, an architecture designed for one audio channel and three video channels may be unsuitable to use in a situation with four audio channels and vice versa.

Therefore, there is a need for more flexible time-interleaved analog-to-digital converters.

SUMMARY

It should be emphasized that the term "comprises/comprising" when used in this specification is taken to specify the presence of stated features, integers, steps, or components, but does not preclude the presence or addition of one or more other features, integers, steps, components, or groups thereof.

It is an object of some embodiments to obviate at least some of the above disadvantages and to provide methods and arrangements for configurable operation of a time-interleaved analog-to-digital converter.

According to a first aspect, this is achieved by a method of operating a time-interleaved analog-to-digital converter for conversion of an integer number L of analog input signals to L corresponding digital output signals, wherein L is larger than 1, and the analog input signals and digital output signals are indexed by $i=1, 2, \ldots, L$. The time-interleaved analog-to-digital converter comprises an array of an integer number N of constituent analog-to-digital converters each having an analog input and a digital output, wherein N is larger than L.

The method comprises (for each of the L analog input signals) sampling the analog input signal, selecting a number $N_i$ of constituent analog-to-digital converters from the array of N constituent analog-to-digital converters (wherein $N_i$ is larger than or equal to 1 and $\Sigma_{i=1}^{L} N_i \leq N$), digitizing each sample of the analog input signal in a respective one of the selected $N_i$ constituent analog-to-digital converters, and multiplexing the digitized samples of each of the selected $N_i$ constituent analog-to-digital converters to produce the digital output signal corresponding to the analog input signal.

In some embodiments, $N_i$, $i=1, 2, \ldots, L$, is selected such that $\Sigma_{i=1}^{L} N_i = N$.

For an $i=1, 2, \ldots, L$ where the selected $N_i$ is larger than 1, the step of digitizing each sample of the analog input signal in a respective one of the selected $N_i$ constituent analog-to-digital converters may, according to some embodiments, comprise digitizing a first sample of the analog input signal in a first selected constituent analog-to-digital converter, and digitizing a second sample of the analog input signal in a second selected constituent analog-to-digital converter.

In some embodiments, the $N_i$ constituent analog-to-digital converter that are selected may process respective samples of the analog input signal in a uniform manner, e.g. by processing samples in a round-robin fashion. For example, if the selected $N_i$ is equal to 3, a first sample of the analog input signal may be processed in a first selected constituent analog-to-digital converter, a second sample of the analog input signal may be processed in a second selected constituent analog-to-digital converter, a third sample of the analog input signal may be processed in a third selected constituent analog-to-digital converter, a fourth sample of the analog input signal may be processed in the first selected constituent analog-to-digital converter, etc.

According to some embodiments, the method may further comprise (for each of the L analog input signals) de-multiplexing the analog input signal into $N_i$ de-multiplexed signals, and each sample of the analog input signal may be digitized in a respective one of the selected $N_i$ constituent analog-to-digital converters by processing each of the $N_i$ de-multiplexed signals in the respective one of the selected $N_i$ constituent analog-to-digital converters.

If each of the L digital output signals has a respective sample rate $R_i$ and at least two of the sample rates $R_i$, $i=j,k$ differ from each other such that $R_j > R_k$, then the method may comprise selecting (for each of the L analog input signals) the number $N_i$, i=j,k such that $$\frac{R_j}{R_k} \leq \frac{N_j}{N_k}.$$

If each of the L digital output signals has a respective sample resolution $Q_i$ and at least two of the sample resolutions $Q_i$, i=j,k differ from each other such that $Q_j > Q_k$, then the method may comprise selecting (for each of the L analog input signals) the number $N_i$, i=j,k such that $$\frac{Q_j}{Q_k} \leq \frac{N_j}{N_k}.$$

Typically, the lower the required resolution is, the faster a constituent analog-to-digital converter digitizes an analog sample (at least provided the clocking rate of the constituent analog-to-digital converter is not changed).

The method may, according to some embodiments, comprise sampling each of the L analog input signals before or after splitting the analog input signal into $N_i$ signal streams.

In some embodiments, sampling the analog input signal may (for at least one of the L analog input signals) comprise sampling the analog input signal at a sample rate which is higher than a sample rate of the digital output signal corresponding to the analog input signal. Thus, the at least one of the L analog input signals is over-sampled. In such embodiments, the method may further comprise post-processing the digitized samples of each of the selected $N_i$ constituent analog-to-digital converters to produce the digital output signal corresponding to the analog input signal. The post-processing may be performed before, after or in conjunction with multiplexing the digitized samples of each of the selected $N_i$ constituent analog-to-digital converters. The post-processing may, for example, comprise decimation of the digitized samples. Oversampling and post-processing together results in the digital output signal having the desired sample rate and one possible benefit is that higher dynamics of the analog-to-digital conversion may be achieved.

A second aspect is a computer program product comprising a computer readable medium, having thereon a computer program comprising program instructions. The computer program is loadable into a data-processing unit and is adapted to cause execution of the method according to the first aspect when the computer program is run by the data-processing unit.

According to a third aspect, a time-interleaved analog-to-digital converter is provided for conversion of an integer number L of analog input signals to L corresponding digital output signals, wherein L is larger than 1 and the analog input signals and digital output signals are indexed by i=1, 2, ..., L. The time-interleaved analog-to-digital converter comprises an array of an integer number N (N is larger than L) of constituent analog-to-digital converters, a controller and a multiplexer.

Each of the constituent analog-to-digital converters has an analog input and a digital output and is adapted to digitize an analog input sample.

The controller is adapted to (for each of the L analog input signals) select a number $N_i$ of constituent analog-to-digital converters from the array of N constituent analog-to-digital converters, wherein $N_i$ is larger than or equal to 1 and $\Sigma_{i=1}^{L}$ $N_i \leq N$, and cause each sample of the analog input signal to be digitized in a respective one of the selected $N_i$ constituent analog-to-digital converters.

The multiplexer is adapted to (for each of the L analog input signals) multiplex the digitized samples of each of the selected $N_i$ constituent analog-to-digital converters to produce the digital output signal corresponding to the analog input signal.

The time-interleaved analog-to-digital converter may, according to some embodiments, further comprise a de-multiplexer adapted to (for each of the L analog input signals) de-multiplex the analog input signal into $N_i$ de-multiplexed signals. In such embodiments, the controller may be adapted to cause each of the $N_i$ de-multiplexed signals to be processed in the respective one of the selected $N_i$ constituent analog-to-digital converters. The time-interleaved analog-to-digital converter may further comprise a sample-and-hold unit for each of the L analog input signals, adapted to provide analog input samples to the de-multiplexer.

In other embodiments, the time-interleaved analog-to-digital converter may further comprise a sample-and-hold unit for each of the N constituent analog-to-digital converters, adapted to provide analog input samples to the N constituent analog-to-digital converters.

The controller may, according to embodiments where each of the L digital output signals has a respective sample rate $R_i$ and at least two of the sample rates $R_i$, i=j,k differ from each other such that $R_j > R_k$, be adapted to select $N_i$, i=j,k such that $$\frac{R_j}{R_k} \leq \frac{N_j}{N_k}.$$

The controller may, according to embodiments where each of the L digital output signals has a respective sample resolution $Q_i$ and at least two of the sample resolutions $Q_i$, i=j,k differ from each other such that $Q_j > Q_k$, be adapted to select $N_i$, i=j,k such that $$\frac{Q_j}{Q_k} \leq \frac{N_j}{N_k}.$$

A fourth aspect is an integrated circuit comprising the time-interleaved analog-to-digital converter of the third aspect.

A fifth aspect is an electronic device comprising the time-interleaved analog-to-digital converter of the third aspect or the integrated circuit of the fourth aspect.

In some embodiments, the third, fourth and fifth aspects may additionally have features identical with or corresponding to any of the various features as explained above for the first aspect and vice versa.

An advantage of some embodiments is that a very flexible time interleaved analog-to-digital converter structure is provided for handling of two or more analog input signals.

Another advantage of some embodiments is that, since the time interleaved analog-to-digital converter structure is dynamically configurable (e.g. in software), different sampling rates and/or different resolution required for the different input signals may be accommodated, while the hardware resources are still efficiently utilized.

For example, a wide variety of different applications may be accommodated by a single standard product (i.e. a single hardware design) by adjustably assigning (in a fix configuration or dynamically configured via software) the processing of each input signal to one or more constituent analog-to-digital converters.

A further advantage with some embodiments is that the power consumption may be optimized, since un-used resources (e.g. constituent ADC:s) may be put in a low power mode or may be completely turned off.

Yet another advantage of some embodiments is that an increased possibility to oversample a signal is provided. Oversampling (and, possibly, corresponding decimation) may provide a wider dynamic range than sampling with the required sample rate directly.

BRIEF DESCRIPTION OF THE DRAWINGS

Further objects, features and advantages will appear from the following detailed description of embodiments, with reference being made to the accompanying drawings, in which:

FIG. 1 is a flowchart illustrating example method steps according to some embodiments;

FIG. 2 is a flowchart illustrating example method steps according to some embodiments;

DETAILED DESCRIPTION

Figure 3:
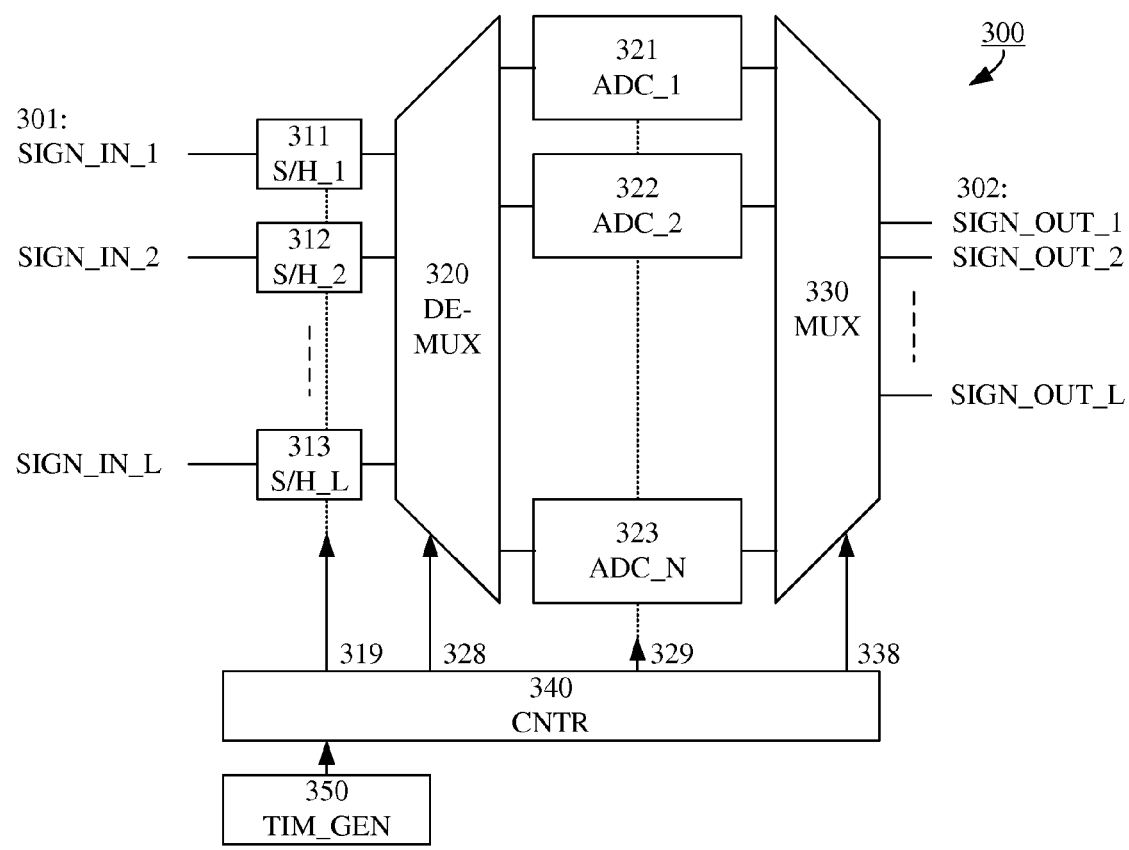
FIG. 3 is a block diagram illustrating an example arrangement according to some embodiments.

In the following, embodiments will be described where each of several analog input signals to a time-interleaved analog-to-digital converter (TI ADC) may be assigned one or more of the (N) constituent ADC:s of the TI ADC. The assignment may be implemented in software, for example and may be dynamically adaptable based on a current input signal situation.

For example, if a first input signal is to be sampled with a sample rate that is higher than that of a second input signal, the second input signal may be assigned fewer constituent ADC:s than the first input signal. Alternatively or additionally, if a first input signal is to be quantized with a resolution that is higher than that of a second input signal, the second input signal may be assigned fewer constituent ADC:s than the first input signal.

Although reference is made herein to situations where two or more of the digital output signals of a TI ADC have different sample rate and/or different resolution, it is to be noted that these example situations are not to be construed as limiting and that embodiments may be applicable also in other situations.

FIG. 1 illustrates an example method 100 of operating a time-interleaved analog-to-digital converter comprising N constituent analog-to-digital converters according to some embodiments. The method steps 120-170 are performed (e.g. in parallel, in semi-parallel or in sequence) for each of L (L<N) analog input signals as indicated in step 110 to produce L corresponding digital output signals.

The analog input signal with index i (i=1, 2, ..., L) is sampled with a sample rate $R_i$ in step 120, and an integer number $N_i$ (and corresponding constituent ADC:s) is selected for this analog input signal in step 130.

The selection of $N_i$ satisfies $\Sigma_{i=1}^{L} N_i \leq N$ (in some embodiments even $\Sigma_{i=1}^{L} N_i = N$) and is typically made to utilize the constituent ADC:s optimally given the conditions of the current situations.

For example, if each of the L digital output signals has a respective sample rate $R_i$ and at least two of the sample rates $R_i$, i=j,k differ from each other such that $R_j > R_k$, then the method may comprise selecting $N_i$, i=j,k such that $$\frac{R_j}{R_k} \leq \frac{N_j}{N_k}$$

and/or if each of the L digital output signals has a respective sample resolution $Q_i$ and at least two of the sample resolutions $Q_i$, i=j,k differ from each other such that $Q_j > Q_k$, then the method may comprise selecting $N_i$, i=j,k such that $$\frac{Q_j}{Q_k} \leq \frac{N_j}{N_k}.$$

In step 140, the sampled analog input signal with index i is divided (e.g. by de-multiplexing) into $N_i$ signal streams (each typically with sample rate $R_i/N_i$), and each of the $N_i$ signal streams is digitized in a respective one of the $N_i$ constituent ADC:s in step 160.

Finally, in step 170, the $N_i$ digital signal streams output from the $N_i$ constituent ADC:s are multiplexed to produce a digital output signal of rate $R_i$.

FIG. 2 illustrates another example method 200 of operating a time-interleaved analog-to-digital converter comprising N constituent analog-to-digital converters according to some embodiments. The method steps 230-270 are performed (e.g. in parallel, in semi-parallel or in sequence) for each of L (L<N) analog input signals as indicated in step 210 to produce L corresponding digital output signals.

An integer number $N_i$ (and corresponding constituent ADC:s) is selected for the analog input signal with index i (i=1, 2, ..., L) in step 230.

The selection of $N_i$ satisfies $\Sigma_{i=1}^{L} N_i < N$ (in some embodiments even $\Sigma_{i=1}^{L} N_i = N$) and is typically made to utilize the constituent ADC:s optimally given the conditions of the current situations.

For example, if each of the L digital output signals has a respective sample rate $R_i$ and at least two of the sample rates $R_i$, i=j,k differ from each other such that $R_j > R_k$, then the method may comprise selecting $N_i$, i=j,k such that $$\frac{R_j}{R_k} \leq \frac{N_j}{N_k}$$

and/or if each of the L digital output signals has a respective sample resolution $Q_i$ and at least two of the sample resolutions $Q_i$, i=j,k differ from each other such that $Q_j > Q_k$, then the method may comprise selecting $N_i$, i=j,k such that $$\frac{Q_j}{Q_k} \le \frac{N_j}{N_k}.$$

In step 250, the analog input signal is sampled for each of the $N_i$ constituent ADC:s with a sample rate $R_i/N_i$. Typically, the sampling times of the different $N_i$ constituent ADC:s are time shifted compared with one another such that they together provide a sampling rate of $R_i$.

In step 260, each of the $N_i$ sample streams is digitized in a respective one of the $N_i$ constituent ADC:s, and the $N_i$ digital signal streams output from the $N_i$ constituent ADC:s are multiplexed to produce a digital output signal of rate $R_i$ in step 270.

FIG. 3 illustrates an example time-interleaved analog-to-digital converter (TI ADC) 300 according to some embodiments. The TI ADC 300 may, for example, be adapted to perform the method 100 described in connection to FIG. 1.

The TI ADC 300 is adapted to convert L analog input signals (SIGN_IN_1, SIGN_IN_2, . . . , SIGN_IN_L) 301 to L corresponding digital output signals (SIGN_OUT_1, SIGN_OUT_2, . . . , SIGN_OUT_L) 302, and comprises an array of N (N>L) constituent analog-to-digital converters (ADC_1, ADC_2, . . . , ADC_L) 321, 322, 323. Each constituent ADC may comprise any suitable known or future ADC implementation. For example, the constituent ADC:s may each comprise a successive approximation ADC such as any of those described in WO 2012/123578 A1 and EP 0624289 B1.

One sample-and-hold unit (S/H_1, S/H_2, . . . , S/H_L) 311, 312, 313 is provided for each of the L analog input signals (indexed by i=1, 2, . . . , L) and each sample-and-hold unit is adapted to sample a respective analog input signal with a sample rate $R_i$. A controller (CNTR) 340 is adapted to control the clocking (e.g. rate and timing) of each of the sample-and-hold units via one or more control signals 319.

The controller 340 is also adapted to select an integer number $N_i$ (and corresponding constituent ADC:s) for each of the L analog input signals. The selection of $N_i$ has been exemplified above and is not elaborated on further here.

Based on the selection, the controller 340 is adapted to cause, by means of one or more control signals 328, a de-multiplexer (DE-MUX) 320 to divide the sample stream (with rate $R_i$) of the analog input signal indexed by i into $N_i$ signal streams (each typically with sample rate $R_i/N_i$). The controller is further adapted to cause each of the $N_i$ signal streams to be processed by a respective one of the $N_i$ constituent ADC:s. The operation (e.g. operational speed and timing of the undertaking of a new analog input sample) of the constituent ADC:s 321, 322, 323 is controlled by the controller 340 via one or more control signals 329.

A multiplexer (MUX) 330 is adapted to, for the analog input signal indexed by i, combine the $N_i$ digital signal streams output from the $N_i$ constituent ADC:s to produce a digital output signal 302 of rate $R_i$. The controller 340 is adapted to control the operation of the multiplexer 330 by means of one or more control signals 338. Typically, the control signals 328 and 338 are tightly correlated such that the multiplexer picks digital samples from the constituent ADC outputs in the same order as the de-multiplexer distributes the corresponding analog samples.

A timing signal generator (TIM_GEN) 350 may be provided in association with the controller 340 (e.g. comprised in the controller or connected to the controller) and may be adapted to provide various timing signals (e.g. operational clock of the constituent ADC:s and triggers to the sample-and-hold units and the constituent ADC:s, etc.) to the controller 340.

Figure 4:
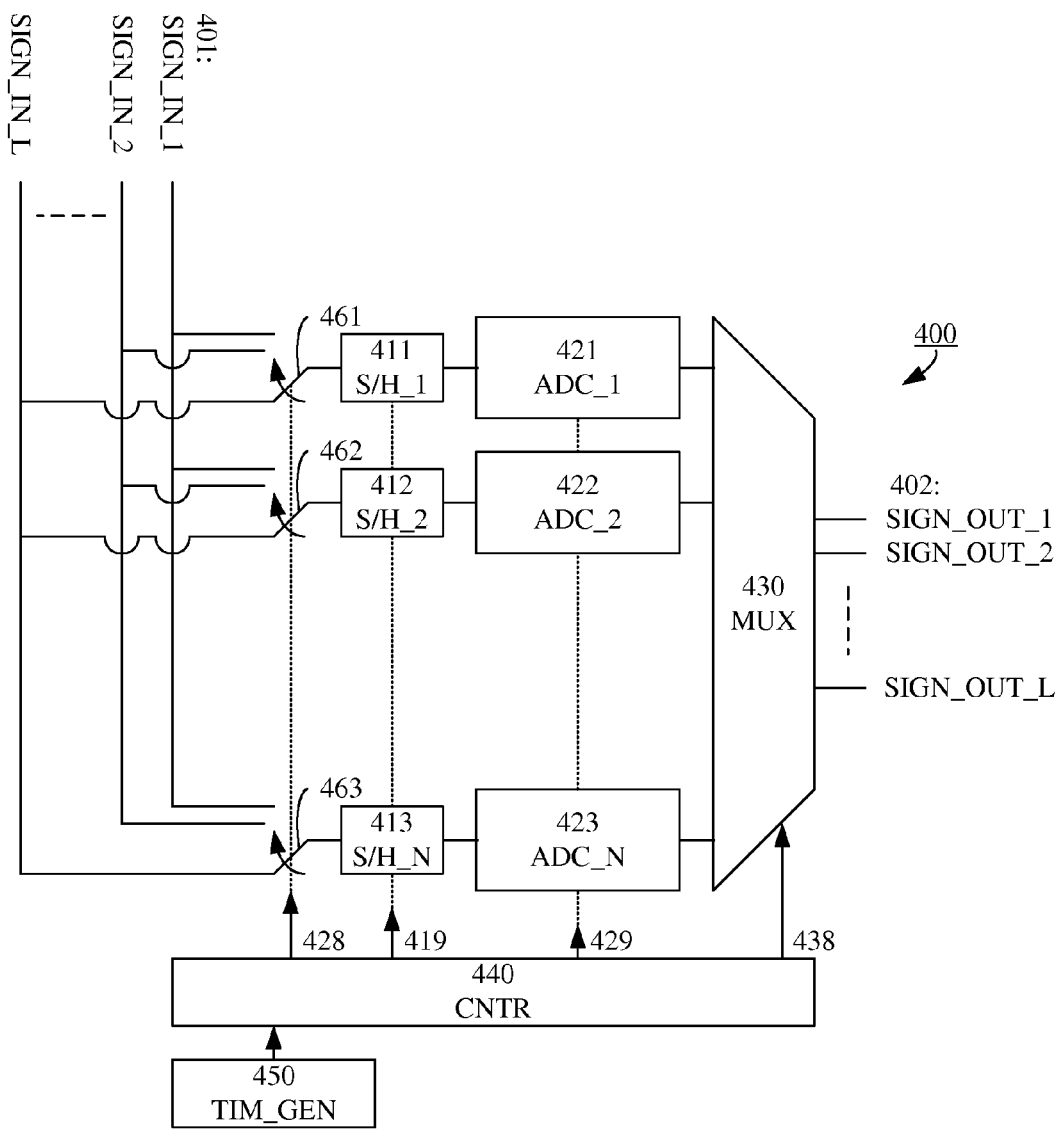
FIG. 4 is a block diagram illustrating an example arrangement according to some embodiments.

FIG. 4 illustrates another example time-interleaved analog-to-digital converter (TI ADC) 400 according to some embodiments. The TI ADC 400 may, for example, be adapted to perform the method 200 described in connection to FIG. 2.

The TI ADC 400 is adapted to convert L analog input signals (SIGN_IN_1, SIGN_IN_2, . . . , SIGN_IN_L) 401 to L corresponding digital output signals (SIGN_OUT_1, SIGN_OUT_2, . . . , SIGN_OUT_L) 402, and comprises an array of N (N>L) constituent analog-to-digital converters (ADC_1, ADC_2, . . . , ADC_L) 421, 422, 423.

A controller (CNTR) 440 is adapted to select an integer number $N_i$ (and corresponding constituent ADC:s) for each of the L analog input signals. The selection of $N_i$ has been exemplified above and is not elaborated on further here.

Based on the selection, the controller 440 is also adapted to control the position of each of N input switches 461, 462, 463 (one for each constituent analog-to-digital converter) by means of one or more control signals 428 such that $N_i$ of the switches is in a position to input the analog input signal indexed by i (i=1, 2, . . . , L) to its corresponding processing path.

One sample-and-hold unit (S/H_1, S/H_2, . . . , S/H_N) 411, 412, 413 is provided for each of the N constituent ADC:s and each sample-and-hold unit is adapted to sample a respective analog input signal with a sample rate $R_i/N_i$. The controller 440 is adapted to control the clocking (e.g. rate and timing) of each of the sample-and-hold units via one or more control signals 419.

The controller is further adapted to cause each of the $N_i$ signal streams for the analog input signal indexed by i to be processed by a respective one of the $N_i$ constituent ADC:s. The operation (e.g. operational speed and timing of the undertaking of a new analog input sample) of the constituent ADC:s 421, 422, 423 is controlled by the controller 440 via one or more control signals 429.

A multiplexer (MUX) 430 is adapted to, for the analog input signal indexed by i, combine the $N_i$ digital signal streams output from the $N_i$ constituent ADC:s to produce a digital output signal 402 of rate $R_i$. The controller 440 is adapted to control the operation of the multiplexer 430 by means of one or more control signals 438. Typically, the control signals 419, 428 and 438 are tightly correlated such that (for the analog input signal indexed by i) the multiplexer picks digital samples from the $N_i$ constituent ADC outputs whose input switch selects the analog input signal indexed by i and in the same order as the corresponding sample-and-hold units are triggered.

A timing signal generator (TIM_GEN) 450 may be provided in association with the controller 440 (e.g. comprised in the controller or connected to the controller) and may be adapted to provide various timing signals (e.g. operational clock of the constituent ADC:s and triggers to the sample-and-hold units and the constituent ADC:s, etc.) to the controller 440.

It should be noted that many implementation details that are not vital to the description of the respective embodiments may be omitted in the figures (e.g. FIGS. 3 and 4) and the corresponding text. For example, additional processing steps (e.g. filtering, amplification, imperfection compensation, etc.) that may be present in each processing path or prior to the provision of the analog signals at the inputs 301, 401 may be excluded. Such omissions are not intended to exclude any possible presence of such features.

Figure 5:
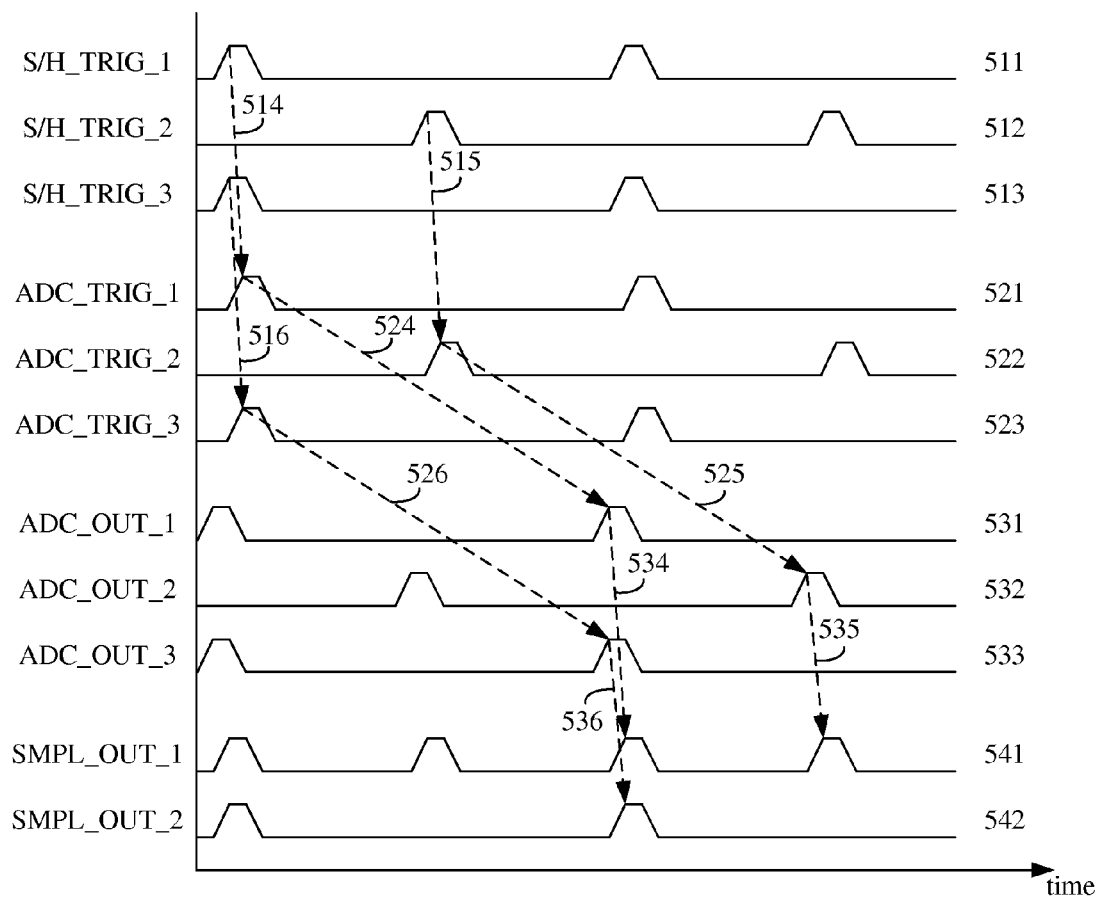
FIG. 5 is a schematic timing diagram illustrating operation of an example arrangement according to some embodiments.

FIG. 5 is a timing diagram that schematically illustrates the relation between example events of a TI ADC structure according to some embodiments. The timing diagram may, for example, be related to a TI ADC structure as that of FIG. 4. In this example, N=3, L=2, $R_1=2R_2$, $Q_1=Q_2$, and a selection of $N_1=2$, $N_2=1$ is made. Thus the first analog input signal is assigned two constituent ADC:s (ADC_1 and ADC_2 in this example) and the second analog input signal is assigned one constituent ADC (ADC_3 in this example).

Starting from the top of the diagram, triggering signals (S/H_TRIG_1, S/H_TRIG_2, S/H_TRIG_3) 511, 512, 513 for the N=3 sample-and-hold units (compare with 411, 412, 413 of FIG. 4) are illustrated. Then follows triggering signals (ADC_TRIG_1, ADC_TRIG_2, ADC_TRIG_3) 521, 522, 523 and corresponding output timings (ADC_OUT_1, ADC_OUT_2, ADC_OUT_3) 531, 532, 533 for the N=3 sample-and-hold units (compare with 421, 422, 423 of FIG. 4). Finally, the timing (SMPL_OUT_1, SMPL_OUT_2) 541, 542 of the L=2 multiplexed output signals are illustrated.

The first analog input signal is input to the first and second processing paths (compare with switches 461 and 462 of FIG. 4). As shown by 511 and 512, the first analog input signal is alternately sampled by the first and second sample-and-hold units (each applying a sample rate $R_1/N_1=R_1/2$). The first and second constituent ADC:s are triggered in connection to the respective sample-and-hold units as illustrated by 521 and 522. The dashed arrow 514 shows the relation between operations of the first sample-and-hold unit and the first constituent ADC while the dashed arrow 515 shows the relation between operations of the second sample-and-hold unit and the second constituent ADC. When the latency period of the respective constituent ADC has passed, a respective output is provided for each constituent ADC trigger as illustrated by 531 and 532. The dashed arrow 524 shows the first constituent ADC latency while the dashed arrow 525 shows the second constituent ADC latency. Signal 541 and the dashed arrows 534 and 535 illustrate that the outputs from the first and second constituent ADC:s are multiplexed to provide an output signal of sample rate $R_1$.

The second analog input signal is input to the third processing path (compare with switch 463 of FIG. 4). As shown by 513, the second analog input signal is sampled by the third sample-and-hold unit (applying a sample rate $R_2/N_2=R_2$). The third constituent ADC is triggered in connection to the respective sample-and-hold unit as illustrated by 523. The dashed arrow 516 shows the relation between operations of the third sample-and-hold unit and the third constituent ADC. When the latency period of the third constituent ADC has passed, a respective output is provided for each constituent ADC trigger as illustrated by 533. The dashed arrow 526 shows the third constituent ADC latency. Signal 542 and the dashed arrow 536 illustrate that the output from the third constituent ADC directly provides an output signal of sample rate $R_2$ (no multiplexing needed since $N_2=1$).

Figure 6:
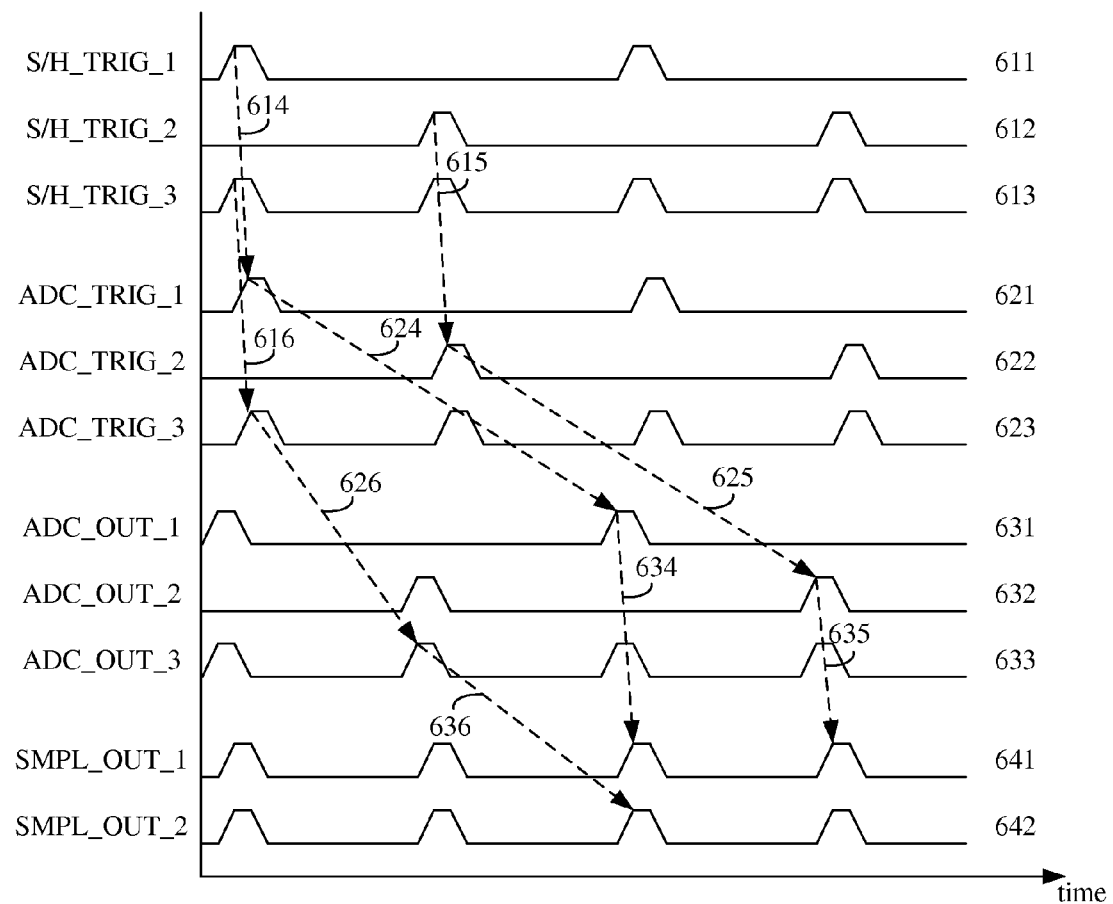
FIG. 6 is a schematic timing diagram illustrating operation of an example arrangement according to some embodiments.

FIG. 6 is a timing diagram that schematically illustrates the relation between example events of a TI ADC structure according to some embodiments. The timing diagram may, for example, be related to a TI ADC structure as that of FIG. 4. In this example, N=3, L=2, $R_1=R_2$, $Q_1=2Q_2$, and a selection of $N_1=2$, $N_2=1$ is made. Thus the first analog input signal is assigned two constituent ADC:s (ADC_1 and ADC_2 in this example) and the second analog input signal is assigned one constituent ADC (ADC_3 in this example).

Starting from the top of the diagram, triggering signals (S/H_TRIG_1, S/H_TRIG_2, S/H_TRIG_3) 611, 612, 613 for the N=3 sample-and-hold units (compare with 411, 412, 413 of FIG. 4) are illustrated. Then follows triggering signals (ADC_TRIG_1, ADC_TRIG_2, ADC_TRIG_3) 621, 622, 623 and corresponding output timings (ADC_OUT_1, ADC_OUT_2, ADC_OUT_3) 631, 632, 633 for the N=3 sample-and-hold units (compare with 421, 422, 423 of FIG. 4). Finally, the timing (SMPL_OUT_1, SMPL_OUT_2) 641, 642 of the L=2 multiplexed output signals are illustrated.

The first analog input signal is input to the first and second processing paths (compare with switches 461 and 462 of FIG. 4). As shown by 611 and 612, the first analog input signal is alternately sampled by the first and second sample-and-hold units (each applying a sample rate $R_1/N_1=R_1/2$). The first and second constituent ADC:s are triggered in connection to the respective sample-and-hold units as illustrated by 621 and 622. The dashed arrow 614 shows the relation between operations of the first sample-and-hold unit and the first constituent ADC while the dashed arrow 615 shows the relation between operations of the second sample-and-hold unit and the second constituent ADC. When the latency period (which is related to the resolution $Q_1$) of the respective constituent ADC has passed, a respective output is provided for each constituent ADC trigger as illustrated by 631 and 632. The dashed arrow 624 shows the first constituent ADC latency while the dashed arrow 625 shows the second constituent ADC latency. Signal 641 and the dashed arrows 634 and 635 illustrate that the outputs from the first and second constituent ADC:s are multiplexed to provide an output signal of sample rate $R_1$.

The second analog input signal is input to the third processing path (compare with switch 463 of FIG. 4). As shown by 613, the second analog input signal is sampled by the third sample-and-hold unit (applying a sample rate $R_2/N_2=R_2$). The third constituent ADC is triggered in connection to the respective sample-and-hold unit as illustrated by 623. The dashed arrow 616 shows the relation between operations of the third sample-and-hold unit and the third constituent ADC. When the latency period (which is related to the resolution $Q_2$ and can be seen to be $Q_1/2$) of the third constituent ADC has passed, a respective output is provided for each constituent ADC trigger as illustrated by 633. The dashed arrow 626 shows the third constituent ADC latency. Signal 642 and the dashed arrow 636 illustrate that the output from the third constituent ADC directly provides an output signal of sample rate $R_2$ (no multiplexing needed since $N_2=1$). In this example, the output signal illustrated by 642 is delayed compared to the third constituent ADC output illustrated by 633 to achieve time alignment with the output signal illustrated by 641 (which suffers from longer constituent ADC latency).

Figure 7:
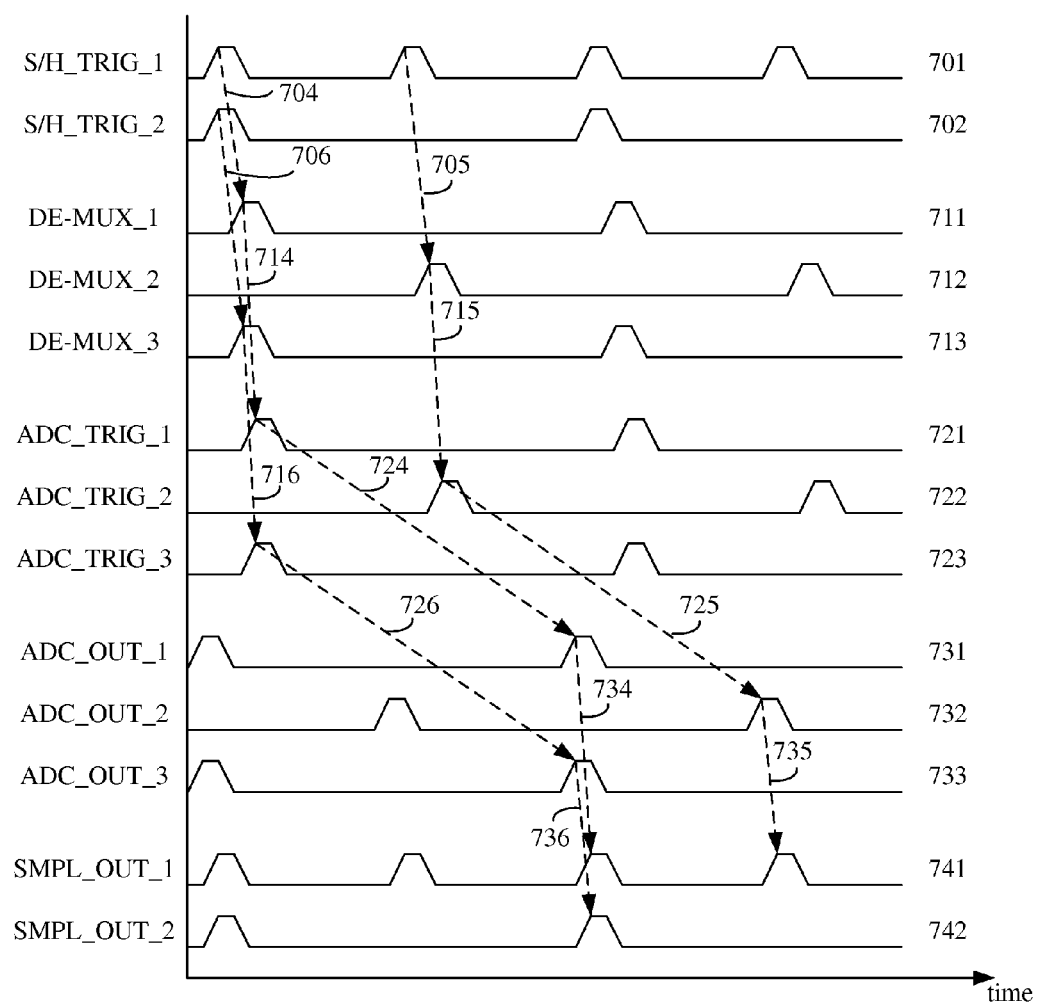
FIG. 7 is a schematic timing diagram illustrating operation of an example arrangement according to some embodiments.

FIG. 7 is a timing diagram that schematically illustrates the relation between example events of a TI ADC structure according to some embodiments. The timing diagram may, for example, be related to a TI ADC structure as that of FIG. 3. In this example, N=3, L=2, $R_1=2R_2$, $Q_1=Q_2$, and a selection of $N_1=2$, $N_2=1$ is made. Thus the first analog input signal is assigned two constituent ADC:s (ADC_1 and ADC_2 in this example) and the second analog input signal is assigned one constituent ADC (ADC_3 in this example).

Starting from the top of the diagram, triggering signals (S/H_TRIG_1, S/H_TRIG_2) 701, 702 for the L=2 sample-and-hold units (compare with 311, 312, 313 of FIG. 3) are illustrated. Then follows de-multiplexer control signals (DE-MUX_1, DE-MUX_2, DE-MUX_3) 711, 712, 713 for the division of the L=2 analog input signals into N=3 processing path signal streams, triggering signals (ADC_TRIG_1, ADC_TRIG_2, ADC_TRIG_3) 721, 722, 723 and corresponding output timings (ADC_OUT_1, ADC_OUT_2, ADC_OUT_3) 731, 732, 733 for the N=3 sample-and-hold units (compare with 321, 322, 323 of FIG. 3). Finally, the timing (SMPL_OUT_1, SMPL_OUT_2) 741, 742 of the L=2 multiplexed output signals are illustrated.

The first analog input signal is sampled by the first sample-and-hold unit (applying a sample rate $R_1$) as illustrated by 701. The sampled signal is divided into two signal streams (each having a sample rate $R_1/N_1=R_1/2$) by a de-multiplexer alternately forwarding samples to its first and second outputs as is illustrated by 711, 712 and dashed arrows 704 and 705. The first and second constituent ADC:s are triggered in connection to the respective de-multiplexer outputs as illustrated by 721 and 722. The dashed arrow 714 shows the relation between the first de-multiplexer output and operations of the first constituent ADC while the dashed arrow 715 shows the relation between the second de-multiplexer output and operations of the second constituent ADC. When the latency period of the respective constituent ADC has passed, a respective output is provided for each constituent ADC trigger as illustrated by 731 and 732. The dashed arrow 724 shows the first constituent ADC latency while the dashed arrow 725 shows the second constituent ADC latency. Signal 741 and the dashed arrows 734 and 735 illustrate that the outputs from the first and second constituent ADC:s are multiplexed to provide an output signal of sample rate $R_1$.

The second analog input signal is sampled by the second sample-and-hold unit (applying a sample rate $R_2$) as illustrated by 702. The sampled signal is directly forwarded to the third de-multiplexer output (since $N_2=1$) as is illustrated by 713 and dashed arrow 706. The third constituent ADC is triggered in connection to the respective de-multiplexer output as illustrated by 723. The dashed arrow 716 shows the relation between the third de-multiplexer output and operations of the third constituent ADC. When the latency period of the third constituent ADC has passed, a respective output is provided for each constituent ADC trigger as illustrated by 733. The dashed arrow 726 shows the third constituent ADC latency. Signal 742 and the dashed arrow 736 illustrate that the output from the third constituent ADC directly provides an output signal of sample rate $R_2$ (no multiplexing needed since $N_2=1$).

Figure 8:
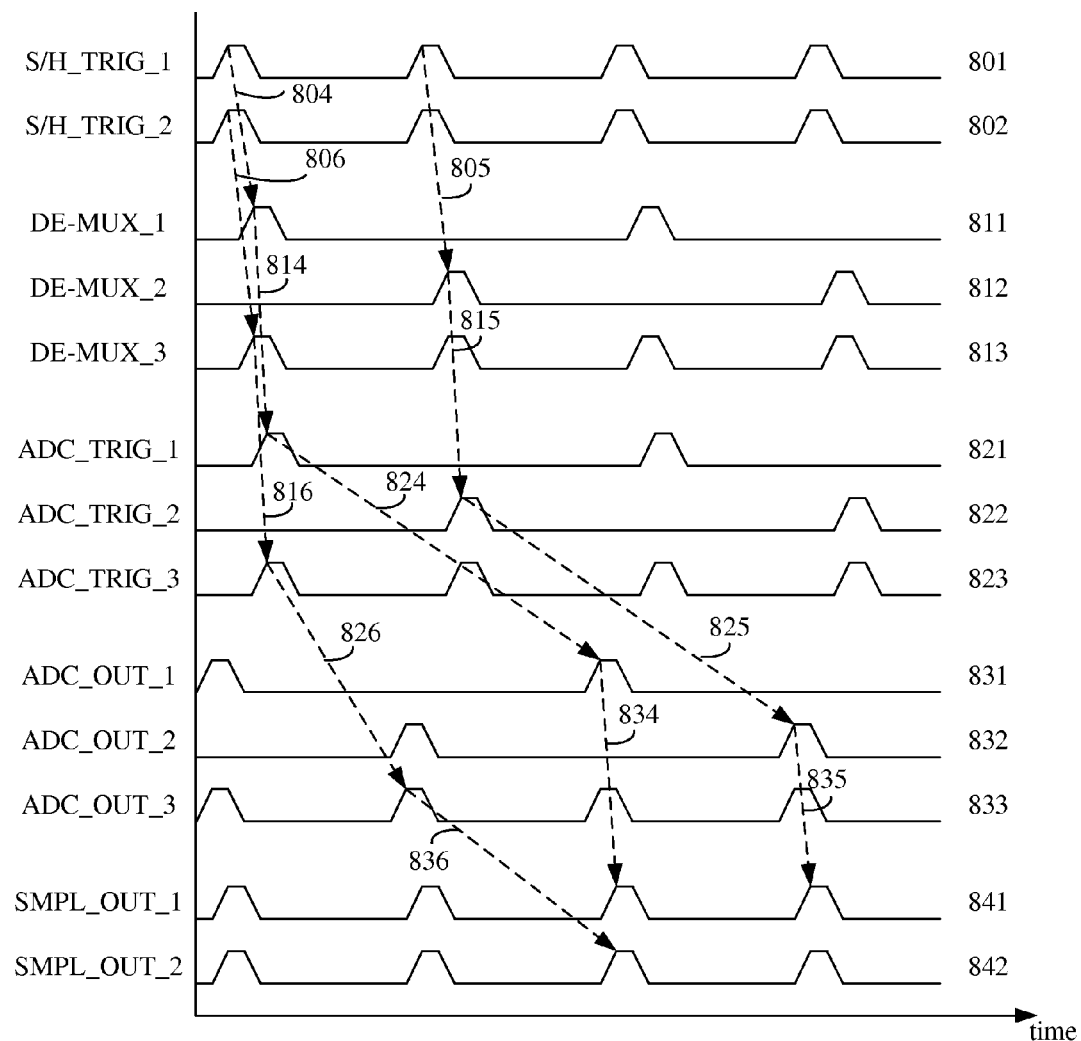
FIG. 8 is a schematic timing diagram illustrating operation of an example arrangement according to some embodiments.

FIG. 8 is a timing diagram that schematically illustrates the relation between example events of a TI ADC structure according to some embodiments. The timing diagram may, for example, be related to a TI ADC structure as that of FIG. 3. In this example, N=3, L=2, $R_1=R_2$, $Q_1=2Q_2$, and a selection of $N_1=2$, $N_2=1$ is made. Thus the first analog input signal is assigned two constituent ADC:s (ADC_1 and ADC_2 in this example) and the second analog input signal is assigned one constituent ADC (ADC_3 in this example).

Starting from the top of the diagram, triggering signals (S/H_TRIG_1, S/H_TRIG_2) 801, 802 for the L=2 sample-and-hold units (compare with 311, 312, 313 of FIG. 3) are illustrated. Then follows de-multiplexer control signals (DE-MUX_1, DE-MUX_2, DE-MUX_3) 811, 812, 813 for the division of the L=2 analog input signals into N=3 processing path signal streams, triggering signals (ADC_TRIG_1, ADC_TRIG_2, ADC_TRIG_3) 821, 822, 823 and corresponding output timings (ADC_OUT_1, ADC_OUT_2, ADC_OUT_3) 831, 832, 833 for the N=3 sample-and-hold units (compare with 321, 322, 323 of FIG. 3). Finally, the timing (SMPL_OUT_1, SMPL_OUT_2) 841, 842 of the L=2 multiplexed output signals are illustrated.

The first analog input signal is sampled by the first sample-and-hold unit (applying a sample rate $R_1$) as illustrated by 801. The sampled signal is divided into two signal streams (each having a sample rate $R_1/N_1=R_1/2$) by a de-multiplexer alternately forwarding samples to its first and second outputs as is illustrated by 811, 812 and dashed arrows 804 and 805. The first and second constituent ADC:s are triggered in connection to the respective de-multiplexer outputs as illustrated by 821 and 822. The dashed arrow 814 shows the relation between the first de-multiplexer output and operations of the first constituent ADC while the dashed arrow 815 shows the relation between the second de-multiplexer output and operations of the second constituent ADC. When the latency period (which is related to the resolution $Q_1$) of the respective constituent ADC has passed, a respective output is provided for each constituent ADC trigger as illustrated by 831 and 832. The dashed arrow 824 shows the first constituent ADC latency while the dashed arrow 825 shows the second constituent ADC latency. Signal 841 and the dashed arrows 834 and 835 illustrate that the outputs from the first and second constituent ADC:s are multiplexed to provide an output signal of sample rate $R_1$.

The second analog input signal is sampled by the second sample-and-hold unit (applying a sample rate $R_2$) as illustrated by 802. The sampled signal is directly forwarded to the third de-multiplexer output (since $N_2=1$) as is illustrated by 813 and dashed arrow 806. The third constituent ADC is triggered in connection to the respective de-multiplexer output as illustrated by 823. The dashed arrow 816 shows the relation between the third de-multiplexer output and operations of the third constituent ADC. When the latency period (which is related to the resolution $Q_2$ and can be seen to be $Q_1/2$) of the third constituent ADC has passed, a respective output is provided for each constituent ADC trigger as illustrated by 833. The dashed arrow 826 shows the third constituent ADC latency. Signal 842 and the dashed arrow 836 illustrate that the output from the third constituent ADC directly provides an output signal of sample rate $R_2$ (no multiplexing needed since $N_2=1$). In this example, the output signal illustrated by 842 is delayed compared to the third constituent ADC output illustrated by 833 to achieve time alignment with the output signal illustrated by 841 (which suffers from longer constituent ADC latency).

It should be noted (as is also illustrated in FIGS. 5 and 7) that the TI ADC hardware where the constituent ADC latency is constant may be optimally, or at least close to optimally, used since the number of constituent ADC:s per input signal is adjustable. Similarly (as is also illustrated in FIGS. 6 and 8), it should be noted that the TI ADC hardware where the constituent ADC latency is varied due to variable resolution (and constant cycle time) may be optimally, or at least close to optimally, used since the number of constituent ADC:s per input signal is adjustable.

According to some embodiments, the dynamic approach to constituent ADC assignment described herein may be combined with an approach where not all constituent ADC:s have to be used and unused constituent ADC:s may possibly be put in a low energy mode.

One example of such an approach is when a flexible digital output signal sampling frequency time-interleaved analog-to-digital converters comprises constituent analog-to-digital converters designed for a particular fixed clock frequency. In such an example, the constituent ADC:s are clocked by an analog-to-digital converter operation clock signal (ADC clock) which typically has a fixed clock period associated with the design and hardware implementation of the constituent ADC:s, and other parts of the TI ADC (e.g. sample-and-hold units) are clocked based on a sample clock the period of which is typically based on a flexible sample rate. The flexibility may be manifested in use in that processing paths that become redundant for a current sample rate may be set to a low energy mode.

The decoupling of the ADC clock from the sampling rate may least to that output samples from the constituent ADC:s are non-equidistant. The output samples may be properly re-aligned based on the sample clock to produce a resulting digital signal with equidistant samples and the desired sample rate.

A controller (e.g. 340, 440 of FIGS. 3 and 4) may, thus be further adapted to select how may and which of the N constituent ADC:s should be used (and put the others into the low energy mode) as well as managing time alignment of signals so that the digital output signals have equidistant sampling.

The described embodiments and their equivalents may be realized in software or hardware or a combination thereof. They may be performed by general-purpose circuits associated with or integral to a communication device, such as digital signal processors (DSP), central processing units (CPU), co-processor units, field-programmable gate arrays (FPGA) or other programmable hardware, or by specialized circuits such as for example application-specific integrated circuits (ASIC). All such forms are contemplated to be within the scope of this disclosure.

Embodiments may appear within an electronic apparatus comprising circuitry/logic or performing methods according to any of the embodiments. The electronic apparatus may, for example, be an analog front-end, a communication device, a multimedia device, an audio/video recorder, etc.

Figure 9:
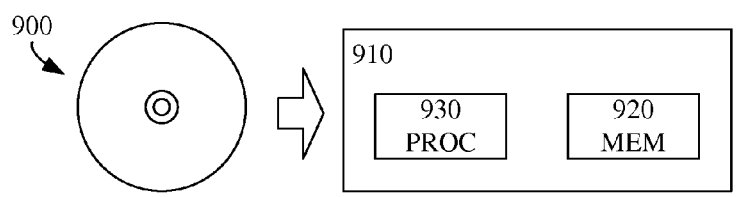
FIG. 9 is a schematic drawing illustrating a computer readable medium according to some embodiments.

According to some embodiments, a computer program product comprises a computer readable medium such as, for example, a diskette or a CD-ROM as illustrated by the CD-ROM 900 of FIG. 9. The computer readable medium may have stored thereon a computer program comprising program instructions. The computer program may be loadable into a data-processing unit 930, which may, for example, be comprised in a device 910. When loaded into the data-processing unit 930, the computer program may be stored in a memory 920 associated with or integral to the data-processing unit 930. According to some embodiments, the computer program may, when loaded into and run by the data-processing unit, cause the data-processing unit to execute method steps according to, for example, any of the methods shown in FIGS. 1 and 2.

Reference has been made herein to various embodiments. However, a person skilled in the art would recognize numerous variations to the described embodiments that would still fall within the scope of the claims. For example, the method embodiments described herein describes example methods through method steps being performed in a certain order. However, it is recognized that these sequences of events may take place in another order without departing from the scope of the claims. Furthermore, some method steps may be performed in parallel even though they have been described as being performed in sequence and vice versa.

In the same manner, it should be noted that in the description of embodiments, the partition of functional blocks into particular units is by no means limiting. Contrarily, these partitions are merely examples. Functional blocks described herein as one unit may be split into two or more units. In the same manner, functional blocks that are described herein as being implemented as two or more units may be implemented as a single unit without departing from the scope of the claims. For example, the controller 340, 440 may be implemented as several units.

Hence, it should be understood that the details of the described embodiments are merely for illustrative purpose and by no means limiting. Instead, all variations that fall within the range of the claims are intended to be embraced therein.

The invention claimed is:

1. A method of operating a time-interleaved analog-to-digital converter for conversion of an integer number L of analog input signals to L corresponding digital output signals, wherein L is larger than 1, the analog input signals and digital output signals are indexed by i =1, 2, . . . , L, and the time-interleaved analog-to-digital converter comprises an array of an integer number N of constituent analog-to-digital converters each having an analog input and a digital output, wherein N is larger than L, the method comprising, for each of the L analog input signals:

sampling the analog input signal;

selecting a number $N_i$ of constituent analog-to-digital converters from the array of N constituent analog-to-digital converters, wherein $N_i$ is larger than or equal to 1 and $\Sigma_{i=1}^{L} N_i \leq N$;

digitizing each sample of the analog input signal in a respective one of the selected $N_i$ constituent analog-to-digital converters; and multiplexing the digitized samples of each of the selected $N_i$ constituent analog-to-digital converters to produce the digital output signal corresponding to the analog input signal.

2. The method of claim 1 wherein, if $N_i$ is larger than 1, digitizing each sample of the analog input signal in a respective one of the selected $N_i$ constituent analog-to-digital converters comprises:

digitizing a first sample of the analog input signal in a first selected constituent analog-to-digital converter; and digitizing a second sample of the analog input signal in a second selected constituent analog-to-digital converter.

3. The method of claim 1 further comprising, for each of the L analog input signals, de-multiplexing the analog input signal into $N_i$ de-multiplexed signals, and wherein digitizing each sample of the analog input signal in a respective one of the selected $N_i$ constituent analog-to-digital converters comprises processing each of the $N_i$ de-multiplexed signals in the respective one of the selected $N_i$ constituent analog-to-digital converters.

4. The method of claim 1 wherein each of the L digital output signals has a respective sample rate $R_i$ and at least two of the sample rates $R_i$, i =j,k differ from each other such that $R_j > R_k$, and wherein selecting, for each of the L analog input signals, the number $N_i$ of constituent analog-to-digital converters comprises selecting $N_i$, i =j,k such that $$\frac{R_j}{R_k} \leq \frac{N_j}{N_k}.$$

5. The method of claim 1 wherein each of the L digital output signals has a respective sample resolution $Q_i$ and at least two of the sample resolutions $Q_i$, i=j,k differ from each other such that $Q_j > Q_k$, and wherein selecting, for each of the L analog input signals, the number $N_i$ of constituent analog-to-digital converters comprises selecting $N_i$, i=j,k such that $$\frac{Q_j}{Q_k} \leq \frac{N_j}{N_k}.$$

6. The method of claim 1 wherein sampling the analog input signal comprises, for at least one of the L analog input signals, sampling the analog input signal at a sample rate which is higher than a sample rate of the digital output signal corresponding to the analog input signal and the method further comprises post-processing the digitized samples of each of the selected $N_i$ constituent analog-to-digital converters to produce the digital output signal corresponding to the analog input signal.

7. A computer program product comprising a computer readable medium, having thereon a computer program comprising program instructions, the computer program being loadable into a data-processing unit and adapted to cause execution of the method according to claim 1 when the computer program is run by the data-processing unit.

8. A time-interleaved analog-to-digital converter for conversion of an integer number L of analog input signals to L corresponding digital output signals, wherein L is larger than 1 and the analog input signals and digital output signals are indexed by i=1, 2, . . . , L, the time-interleaved analog-to-digital converter comprising:
  an array of an integer number N, wherein N is larger than L, of constituent analog-to-digital converters each having an analog input and a digital output and each adapted to digitize an analog input sample;
  a controller adapted to, for each of the L analog input signals:
    select a number $N_i$ of constituent analog-to-digital converters from the array of N constituent analog-to-digital converters, wherein $N_i$ is larger than or equal to 1 and $\Sigma_{i=1}^{L} N_i \leq N$; and
    cause each sample of the analog input signal to be digitized in a respective one of the selected $N_i$ constituent analog-to-digital converters; and
  a multiplexer adapted to, for each of the L analog input signals, multiplex the digitized samples of each of the selected $N_i$ constituent analog-to-digital converters to produce the digital output signal corresponding to the analog input signal.

9. The time-interleaved analog-to-digital converter of claim 8 further comprising a de-multiplexer adapted to, for each of the L analog input signals, de-multiplex the analog input signal into $N_i$ de-multiplexed signals, and wherein the controller is adapted to cause each of the $N_i$ de-multiplexed signals to be processed in the respective one of the selected $N_i$ constituent analog-to-digital converters.

10. The time-interleaved analog-to-digital converter of claim 9 further comprising a sample-and-hold unit for each of the L analog input signals, adapted to provide analog input samples to the de-multiplexer.

11. The time-interleaved analog-to-digital converter of claim 8 further comprising a sample-and-hold unit for each of the N constituent analog-to-digital converters, adapted to provide analog input samples to the N constituent analog-to-digital converters.

12. The time-interleaved analog-to-digital converter of claim 8 wherein each of the L digital output signals has a respective sample rate $R_i$ and at least two of the sample rates $R_i$, i=j,k differ from each other such that $R_j > R_k$, and wherein the controller is adapted to select, for each of the L analog input signals, the number $N_i$, i=j,k of constituent analog-to-digital converters such that $$\frac{R_j}{R_k} \leq \frac{N_j}{N_k}.$$

13. The time-interleaved analog-to-digital converter of claim 8 wherein each of the L digital output signals has a respective sample resolution $Q_i$ and at least two of the sample resolutions $Q_i$, i=j,k differ from each other such that $Q_j > Q_k$, and wherein the controller is adapted to select, for each of the L analog input signals, the number $N_i$, i=j,k of constituent analog-to-digital converters such that $$\frac{Q_j}{Q_k} \leq \frac{N_j}{N_k}.$$

14. An integrated circuit comprising the time-interleaved analog-to-digital converter of claim 8.

15. An electronic device comprising the integrated circuit of claim 14.

16. An electronic device comprising the time-interleaved analog-to-digital converter of claim 8.

* * * * *